United States Patent
Morita et al.

(10) Patent No.: US 10,246,613 B2
(45) Date of Patent: Apr. 2, 2019

(54) LIGHT-REFLECTIVE ANISOTROPIC CONDUCTIVE ADHESIVE AND LIGHT-EMITTING DEVICE

(71) Applicant: DEXERIALS CORPORATION, Tokyo (JP)

(72) Inventors: Keisuke Morita, Utsunomiya (JP); Tomoyasu Sunaga, Shimotsuga-gun (JP)

(73) Assignee: DEXERIALS CORPORATION, Tokyo (JP)

( * ) Notice: Subject to any disclaimer, the term of this patent is extended or adjusted under 35 U.S.C. 154(b) by 137 days.

(21) Appl. No.: 14/402,035

(22) PCT Filed: Jun. 11, 2013

(86) PCT No.: PCT/JP2013/066032
§ 371 (c)(1),
(2) Date: Nov. 18, 2014

(87) PCT Pub. No.: WO2013/187390
PCT Pub. Date: Dec. 19, 2013

(65) Prior Publication Data
US 2015/0166847 A1    Jun. 18, 2015

(30) Foreign Application Priority Data

Jun. 15, 2012   (JP) ................. 2012-136115

(51) Int. Cl.
*C09J 9/02*       (2006.01)
*C09J 183/08*     (2006.01)
(Continued)

(52) U.S. Cl.
CPC .............. *C09J 9/02* (2013.01); *C09J 183/08* (2013.01); *H01B 1/22* (2013.01); *H01L 24/29* (2013.01);
(Continued)

(58) Field of Classification Search
CPC ... H01B 1/22; H01B 1/20; H01B 1/24; H01B 1/02; H01B 1/04; C09J 9/02; C09J 163/00; C09J 183/08
(Continued)

(56) References Cited

U.S. PATENT DOCUMENTS 6,812,065 B1 * 11/2004 Kitamura ................. H01B 1/22
156/330
8,852,462 B2 * 10/2014 Umakoshi ............... H01L 33/60
252/500
(Continued)

FOREIGN PATENT DOCUMENTS

JP          A 11-168235         6/1999
JP          A 2004-002784       1/2004
(Continued)

OTHER PUBLICATIONS

Sep. 17, 2013 Search Report issued in International Patent Application No. PCT/JP2013/066032.
(Continued)

*Primary Examiner* — Tri V Nguyen
(74) *Attorney, Agent, or Firm* — Oliff PLC

(57) ABSTRACT

A light-reflective anisotropic conductive adhesive used for anisotropic conductive connection of a light-emitting element to a wiring substrate includes a thermosetting resin composition, conductive particles, and light-reflective insulating particles. The thermosetting resin composition includes a diglycidyl isocyanuryl modified polysiloxane represented by the formula (1), and a curing agent for an epoxy resin.

(Continued)

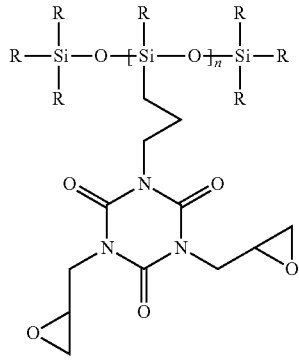

(1)

17 Claims, 3 Drawing Sheets

(51) Int. Cl.
  H01B 1/22        (2006.01)
  H01L 33/62       (2010.01)
  H01L 33/46       (2010.01)
  H01L 23/00       (2006.01)
  H05K 3/32        (2006.01)
  C08G 77/388      (2006.01)
  C08K 9/10        (2006.01)

(52) U.S. Cl.
  CPC .............. *H01L 33/46* (2013.01); *H01L 33/62* (2013.01); *H05K 3/323* (2013.01); *C08G 77/388* (2013.01); *C08K 9/10* (2013.01); *C08K 2201/001* (2013.01); *H01L 2224/16225* (2013.01); *H01L 2224/32225* (2013.01); *H01L 2224/45144* (2013.01); *H01L 2224/48091* (2013.01); *H01L 2224/48227* (2013.01); *H01L 2224/73204* (2013.01); *H01L 2224/73265* (2013.01); *H01L 2924/07811* (2013.01); *H01L 2924/12041* (2013.01); *H01L 2924/181* (2013.01); *H05K 2201/10106* (2013.01); *H05K 2201/2054* (2013.01)

(58) Field of Classification Search
  USPC .................................. 252/500–519.1, 519.3
  See application file for complete search history.

(56) References Cited

U.S. PATENT DOCUMENTS

| 2005/0209400 | A1 |   | 9/2005  | Tsumura et al. |           |
|--------------|----|---|---------|----------------|-----------|
| 2010/0193961 | A1 | * | 8/2010  | Konishi        | C08L 63/00 |
|              |    |   |         |                | 257/773   |
| 2012/0248495 | A1 | * | 10/2012 | Umakoshi       | H01L 24/83 |
|              |    |   |         |                | 257/99    |
| 2013/0087825 | A1 | * | 4/2013  | Umakoshi       | H01L 33/60 |
|              |    |   |         |                | 257/99    |
| 2014/0346710 | A1 | * | 11/2014 | Usui           | C08J 5/18 |
|              |    |   |         |                | 264/442   |

FOREIGN PATENT DOCUMENTS

| JP | A 2005-068295  |   | 3/2005  |             |
|----|----------------|---|---------|-------------|
| JP | A 2006-206919  |   | 8/2006  |             |
| JP | A 2010-248410  |   | 11/2010 |             |
| JP | A 2010-285507  |   | 12/2010 |             |
| JP | 2012057006     | * | 3/2012  | C08G 59/20  |
| JP | A 2012-052029  |   | 3/2012  |             |
| JP | A 2012-180489  |   | 9/2012  |             |
| WO | WO2011155348   | * | 12/2011 | H01L 33/62  |
| WO | WO2011158942   | * | 12/2011 | B29D 7/01   |
| WO | WO2012124724   | * | 9/2012  | C09J 183/04 |

OTHER PUBLICATIONS

Nov. 4, 2015 Office Action issued in Chinese Patent Application No. 201380030476.3.

* cited by examiner

LIGHT-REFLECTIVE ANISOTROPIC CONDUCTIVE ADHESIVE AND LIGHT-EMITTING DEVICE

TECHNICAL FIELD

The present invention relates to a light-reflective anisotropic conductive adhesive used for anisotropic conductive connection of a light-emitting element to a wiring substrate, and a light-emitting device in which a light-emitting element is mounted on a wiring substrate by using the adhesive.

BACKGROUND ART

Light-emitting devices using a light-emitting diode (LED) element have been widely used. A light-emitting device of a previous type has a structure in which an LED element 33 is bonded to a substrate 31 with a die bond adhesive 32, a p electrode 34 and an n electrode 35 thereon are wire-bonded to a connecting terminal 36 of the substrate 31 with a gold wire 37, and the whole LED element 33 is sealed with a transparent mold resin 38, as shown in FIG. 3. However, in the light-emitting device of FIG. 3, of light emitted by the LED element 33, the gold wire absorbs light having a wavelength of 400 to 500 nm that is emitted toward the top face side and the die bond adhesive 32 absorbs some light that is emitted toward the bottom face side. Therefore, there is a problem of reduction in the light-emitting efficiency of the LED element 33.

From the viewpoint of improvement of light-emitting efficiency on light reflection of the LED element, as shown in FIG. 4, flip-chip mounting of an LED element 33 has been proposed (Patent Literature 1). In this flip-chip mounting technique, bumps 39 formed are provided to a p electrode 34 and an n electrode 35, respectively, and a light-reflective layer 40 is provided on a bump-forming face of the LED element 33 so that the light-reflective layer 40 is insulated from the p electrode 34 and the n electrode 35. Then an anisotropic conductive paste 41 or an anisotropic conductive film (not shown) is used to connect or fix the LED element 33 and a substrate 31 by curing the anisotropic conductive paste 41 or anisotropic conductive film. Therefore, in the light-emitting device of FIG. 4, the light output upward the LED element 33 is not absorbed by the gold wire and most of the light output downward is reflected off the light-reflective layer 40 and is output upward. Thus, the light-emitting efficiency (light extraction efficiency) does not reduce.

In addition to the viewpoint of improvement of light-emitting efficiency of the LED element by light reflection, from the viewpoint of preventing the color of light output from the LED element from being changed by discoloring, by heat or light, an insulating resin component in the anisotropic conductive paste or the anisotropic conductive film that is used in mounting of the LED element, a two-liquid curable methyl silicone resin or a two-liquid curable phenyl silicone resin that has excellent heat resistance and light resistance is tried to be employed for the insulating resin component in the anisotropic conductive paste or the anisotropic conductive film.

CITATION LIST

Patent Literature

Patent Literature 1: Japanese Patent Application Laid-Open No. Hei. 11-168235

SUMMARY OF INVENTION

Technical Problem

However, in the technique in Patent Literature 1, the light-reflective layer 40 has to be provided on the LED element 33 by metal vapor deposition so as to be insulated from the p electrode 34 and the n electrode 35. Therefore, in terms of production, there is a problem in which an increase in cost cannot be avoided. On the other hand, when the light-reflective layer 40 is not provided, the surface of conductive particles coated with gold, nickel, or copper in the cured anisotropic conductive paste or anisotropic conductive film is brown or dark brown. Further, an epoxy resin binder itself in which the conductive particles are dispersed is also brown due to an imidazole-based latent curing agent commonly used for curing. Therefore, there is a problem in which it is difficult to increase the light-emitting efficiency (light extraction efficiency) of the light emitted by a light-emitting element.

When the two-liquid curable methyl silicone resin or the two-liquid curable phenyl silicone resin is employed for the insulating resin component in the anisotropic conductive paste or the anisotropic conductive film, the discoloration of the insulating resin component by heat or light can be suppressed. However, there is a problem in which the peel strength (die shear strength) of the LED element against the mounting substrate is not enough for practical use.

An object of the present invention is to solve the above-described problems in the conventional techniques, and to provide an anisotropic conductive adhesive that is capable of improving light-emitting efficiency even without providing a light-reflective layer on a light-emitting diode (LED) element, the light-reflective layer that may increase the production cost during production of a light-emitting device by flip-chip mounting a light-emitting element such as the LED element on a wiring substrate with the anisotropic conductive adhesive, and that is unlikely to be discolored by heat or light and has a die shear strength sufficient for practical use. A further object of the present invention is to provide a light-emitting device produced by flip-chip mounting a light-emitting element on a wiring substrate with the adhesive.

Solution to Problem

The present inventors have found that the reduction in the light-emitting efficiency of a light-emitting element can be suppressed by mixing light-reflective insulating particles in an anisotropic conductive adhesive under the assumption that when the anisotropic conductive adhesive itself has a light reflection function, the reduction in the light-emitting efficiency can be suppressed. Further, the present inventors have found that, when a diglycidyl isocyanuryl modified polysiloxane having a specific structure is used as an insulating adhesive component in the anisotropic conductive adhesive, the anisotropic conductive adhesive can be prevented from being discolored by heat or light, and has a die shear strength sufficient for practical use. Based on these findings, the present invention has been completed.

The present invention provides a light-reflective anisotropic conductive adhesive that is used for anisotropic conductive connection of a light-emitting element to a wiring substrate, and includes a thermosetting resin composition, conductive particles, and light-reflective insulating particles, wherein the thermosetting resin composition includes a diglycidyl isocyanuryl modified polysiloxane represented by the formula (1) and a curing agent for an epoxy resin.

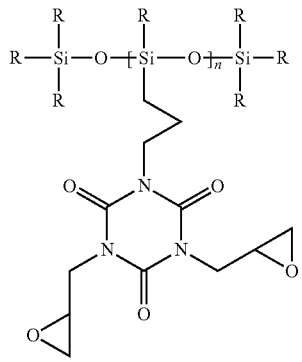

(1)

In the formula (1), R represents an alkyl group or an aryl group, and n represents 1 to 40.

As a particularly preferred aspect of the light-reflective anisotropic conductive adhesive, the present invention provides a light-reflective anisotropic conductive adhesive in which the conductive particles are light-reflective conductive particles each having a core particle coated with a metal material and a light-reflective layer formed from at least one kind of inorganic particles selected from titanium oxide particles, boron nitride particles, zinc oxide particles, and aluminum oxide particles on the surface of the core particle.

Further, the present invention provides a light-emitting device produced by flip-chip mounting a light-emitting element on a wiring substrate with the light-reflective anisotropic conductive adhesive interposed therebetween.

Advantageous Effects of Invention

The light-reflective anisotropic conductive adhesive of the present invention used for anisotropic conductive connection of a light-emitting element to a wiring substrate includes a thermosetting resin composition as a binder, light-reflective insulating particles, and conductive particles. The thermosetting resin composition includes a diglycidyl isocyanuryl modified polysiloxane represented by the formula (1) to be cured by a curing agent for an epoxy resin. The polysiloxane has a side chain having a diglycidyl isocyanuryl alkyl group bonded thereto. For this reason, the anisotropic conductive adhesive can be prevented from being discolored by heat or light, and a die shear strength sufficient for practical use can be achieved.

Since the light-reflective anisotropic conductive adhesive of the present invention includes light-reflective insulating particles, light can be reflected by the same. In particular, when the light-reflective insulating particles are at least one kind of inorganic particles selected from the group consisting of titanium oxide particles, boron nitride particles, zinc oxide particles, and aluminum oxide particles or resin-coated metal particles in which the surface of flaky or spherical metal particles is coated with an insulating resin, the particles themselves are almost white. For this reason, the wavelength dependence of reflectivity to the visible light is low. Therefore, the light-emitting efficiency can be improved, and the light-emitting color of a light-emitting element can be reflected as it is.

Further, when light-reflective conductive particles each having a core particle coated with a metal material and a white to gray light-reflective layer formed from titanium oxide particles, boron nitride particles, zinc oxide particles, or aluminum oxide particles on the surface thereof are used as the conductive particles, the light-reflective conductive particles themselves are white to gray. For this reason, the wavelength dependence of reflectivity to the visible light is low. Therefore, the light-emitting efficiency can be further improved, and the light-emitting color of a light-emitting element can be reflected as it is.

DESCRIPTION OF EMBODIMENTS

Figure 1A:
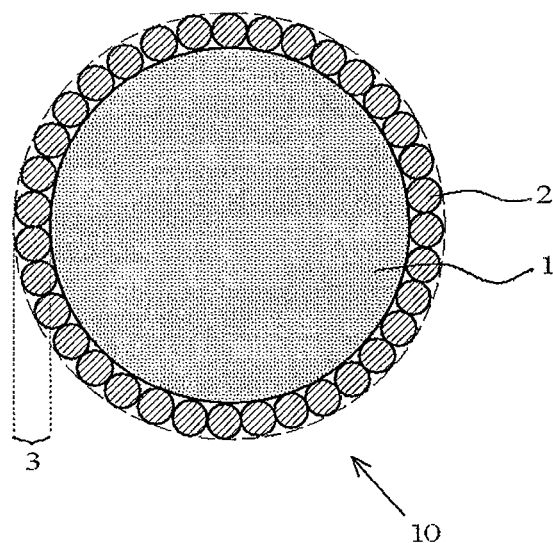
FIG. 1A is a cross-sectional view of a light-reflective conductive particle used for a light-reflective anisotropic conductive adhesive of the present invention.

The present invention is a light-reflective anisotropic conductive adhesive that is used for anisotropic conductive connection of a light-emitting element to a wiring substrate and includes a thermosetting resin composition, conductive particles, and light-reflective insulating particles. First, the thermosetting resin composition serving as a binder will be described.

<Thermosetting Resin Composition>

In the present invention, the thermosetting resin composition includes a diglycidyl isocyanuryl modified polysiloxane represented by the formula (1), and a curing agent for an epoxy resin. Since the diglycidyl isocyanuryl modified polysiloxane represented by the formula (1) is included, the anisotropic conductive adhesive can be prevented from being discolored by heat or light, and a die shear strength sufficient for practical use can be achieved.

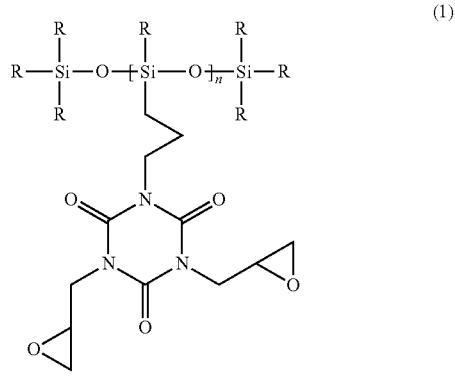

(1)

In the formula (1), R represents an alkyl group such as a lower alkyl group having 1 to 6 carbon atoms or an aryl group such as a carbocyclic aromatic group and a heterocyclic aromatic group. Specific preferred examples of the alkyl group may include a methyl group, an ethyl group, a propyl group, an isopropyl group, a butyl group, and an isobutyl group. A methyl group is particularly preferred. Specific preferred examples of the aryl group may include a phenyl group. n is an integer of 1 to 40, preferably an integer of 1 to 4, and more preferably 1 or 2.

When the content of the diglycidyl isocyanuryl modified polysiloxane represented by the formula (1) in the thermosetting resin composition is too small, the adhesion performance of the light-reflective anisotropic conductive adhesive tends to reduce. When it is too large, the amount of uncured epoxy component tends to excessively increase. Therefore, the content is preferably 45 to 65% by mass, and more preferably 50 to 60% by mass.

Further, the diglycidyl isocyanuryl modified polysiloxane represented by the formula (1) can be prepared by uniformly mixing a hydrogen polysiloxane of a formula (a) and 1-allyl-3,5-diglycidyl isocyanurate of a formula (b), and heating the mixture at room temperature to 150° C. in the presence of a Karstedt catalyst (1,3-divinyl-1,1,3,3-tetramethyldisiloxane platinum (0) complex solution), as shown in the following reaction formula. From the reaction mixture, the compound of the formula (1) can be isolated by a conventional method (concentration treatment, column treatment, etc.).

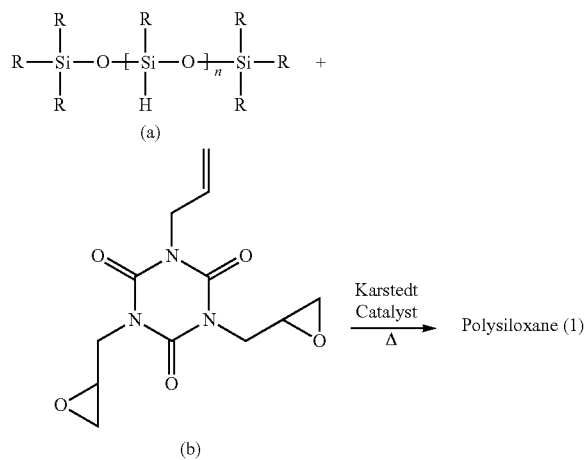

In addition to the diglycidyl isocyanuryl modified polysiloxane of the formula (1), the thermosetting resin composition may include a heterocyclic epoxy compound, an alicyclic epoxy compound, and a hydrogenated epoxy compound within a range in which the effects of the present invention are not impaired.

Examples of the heterocyclic epoxy compound may include epoxy compounds having a triazine ring. Specific examples thereof may include 1,3,5-tris(2,3-epoxypropyl)-1,3,5-triazine-2,4,6-(1H,3H,5H)-trione (i.e., triglycidyl isocyanurate).

Preferred examples of the alicyclic epoxy compound may include compounds having two or more epoxy groups in the molecules. These compounds may be liquid or solid. Among these, glycidyl hexahydrobisphenol A and 3,4-epoxycyclohexenylmethyl-3',4'-epoxycyclohexene carboxylate are preferably used since a cured product can secure light transmissivity suitable for mounting of an LED element and rapid curing properties are excellent.

As the hydrogenated epoxy compound, hydrogenated compounds of the heterocyclic epoxy compound and the alicyclic epoxy compound described above, and another known hydrogenated epoxy resin can be used.

The alicyclic epoxy compound, the heterocyclic epoxy compound, and the hydrogenated epoxy compound may be used alone or in combination of two or more kinds thereof, for the diglycidyl isocyanuryl modified polysiloxane of the formula (1). Another epoxy compound may be used in combination with these epoxy compounds as long as the effects of the present invention are not impaired. Examples thereof may include a glycidyl ether obtained by reacting epichlorohydrin with a polyhydric phenol such as bisphenol A, bisphenol F, bisphenol S, tetramethyl bisphenol A, diallyl bisphenol A, hydroquinone, catechol, resorcinol, cresol, tetrabromobisphenol A, trihydroxybiphenyl, benzophenone, bisresorcinol, bisphenol hexafluoroacetone, tetramethyl bisphenol A, tetramethyl bisphenol F, tris(hydroxyphenyl) methane, bixylenol, phenol novolac, and cresol novolac; a polyglycidyl ether obtained by reacting epichlorohydrin with an aliphatic polyhydric alcohol such as glycerol, neopentyl glycol, ethylene glycol, propylene glycol, butylene glycol, hexylene glycol, polyethylene glycol, and polypropylene glycol; a glycidyl ether ester obtained by reacting epichlorohydrin with hydroxycarboxylic acid such as p-oxybenzoic acid and β-oxynaphthoic acid; a polyglycidyl ester obtained from polycarboxylic acid such as phthalic acid, methylphthalic acid, isophthalic acid, terephthalic acid, tetrahydrophthalic acid, endomethylene tetrahydrophthalic acid, endomethylene hexahydrophthalic acid, trimellitic acid, and polymerized fatty acid; a glycidylaminoglycidyl ether obtained from aminophenol and aminoalkylphenol; a glycidylaminoglycidyl ester obtained from aminobenzoic acid; a glycidylamine obtained from aniline, toluidine, tribromoaniline, xylylenediamine, diaminocyclohexane, bisaminomethylcyclohexane, 4,4'-diaminodiphenyl methane, and 4,4'-diaminodiphenyl sulfone; and known epoxy resins such as epoxidized polyolefin.

As the curing agent for an epoxy resin, a known curing agent for an epoxy resin can be used. For example, a curing agent for an epoxy resin selected from an amine-based curing agent, a polyamide-based curing agent, an acid anhydride-based curing agent, an imidazole-based curing agent, a polymercaptan-based curing agent, a polysufide-based curing agent, a boron trifluoride-amine complex-based curing agent, dicyandiamide, and an organic acid hydrazide can be used. Among them, the acid anhydride-based curing agent can be preferably used from the viewpoints of light transmissivity and heat resistance.

Examples of the acid anhydride-based curing agent may include succinic anhydride, phthalic anhydride, maleic anhydride, trimellitic anhydride, pyromellitic anhydride, hexahydrophthalic anhydride, 3-methyl-hexahydrophthalic anhydride, 4-methyl-hexahydrophthalic anhydride, a mixture of 4-methyl-hexahydrophthalic anhydride and hexahydrophthalic anhydride, tetrahydrophthalic anhydride, methyl-tetrahydrophthalic anhydride, nadic anhydride, methylnadic anhydride, norbornane-2,3-dicarboxylic anhydride, methylnorbornane-2,3-dicarboxylic anhydride, and methylcyclohexenedicarboxylic anhydride.

When the mixing amount of the curing agent for an epoxy resin such as an acid anhydride-based curing agent in the thermosetting resin composition is too small relative to 100 parts by mass of the diglycidyl isocyanuryl modified polysiloxane represented by the formula (1), the amount of uncured epoxy component tends to excessively increase. When it is too large, the corrosion of a material to be attached tends to proceed by the effect of the excess curing agent. Therefore, it is preferably 50 to 120 parts by mass, and more preferably 60 to 100 parts by mass.

In order to smoothly complete a curing reaction for a shorter time, the thermosetting resin composition may include a known curing accelerator. Preferred examples of the curing accelerator may include a quaternary phosphonium salt-based curing accelerator and an imidazole-based curing accelerator. Specific examples thereof may include a bromide salt of quaternary phosphonium ("U-CAT5003"™ available from San-Apro Ltd.) and 2-ethyl-4-methylimidazole. In particular, as a curing accelerator for an acid anhydride-based curing agent, an imidazole-based curing accelerator can be preferably used. In this case, when the addition amount of the imidazole-based curing accelerator is too small, curing tends to be insufficient. When it is too large, discoloration caused by heat and light tends to increase. Therefore, the addition amount of the imidazole-based curing accelerator is preferably 0.20 to 2.00 parts by mass, and more preferably 0.60 to 1.00 parts by mass, relative to 100 parts by mass of the acid anhydride-based curing agent.

The thermosetting resin composition described above preferably uses colorless, transparent materials. This is because the light-reflective efficiency of the light-reflective conductive particles in the anisotropic conductive adhesive is not reduced, and the incident light is reflected without change in the color of the incident light. The colorless and transparent herein means that in the cured product of the anisotropic conductive adhesive, the light transmissivity (JIS K7105) of visible light having a wavelength of 380 to 780 nm in a light path length of 1 mm is 80% or more, and preferably 90% or more.

<Light-Reflective Insulating Particle>

The light-reflective insulating particles in the light-reflective anisotropic conductive adhesive of the present invention are to reflect light that has entered the anisotropic conductive adhesive outward.

Light-reflective particles include metal particles, particles formed by coating metal particles with a resin, inorganic particles of metal oxide, metal nitride, or metal sulfide that are gray to white under the natural light, particles formed by coating resin core particles with inorganic particles, and particles having an irregular surface regardless of materials of the particles. However, among the particles, the metal particles that do not have an insulating coating are not included. This is because the light-reflective insulating particles usable in the present invention are required to exhibit insulating properties. Further, among the metal oxide particles, conductive particles, like ITO, cannot be used. Moreover, inorganic particles that have light reflectivity and insulation properties but have a refractive index lower than that of the used thermosetting resin composition, like $SiO_2$, cannot be used.

Specific preferred examples of the light-reflective insulating particles may include at least one kind of inorganic particles selected from the group consisting of titanium oxide ($TiO_2$) particles, boron nitride (BN) particles, zinc oxide (ZnO) particles, and aluminum oxide ($Al_2O_3$) particles. Among these, $TiO_2$ is preferably used in terms of high refractive index.

The light-reflective insulating particles may have spherical, scale-like, amorphous, and needle-like shapes. In consideration of reflective efficiency, spherical and scale-like shapes are preferred. When the diameter of spherical particles is too small, the reflectance tends to decrease. When it is too large, anisotropic conductive connection is likely to be inhibited. Therefore, it is preferably 0.02 to 20 μm, and more preferably 0.2 to 1 μm. When the shape is scale-like, the longest diameter is preferably 0.1 to 100 μm and more preferably 1 to 50 μm, the shortest diameter is preferably 0.01 to 10 μm and more preferably 0.1 to 5 μm, and the thickness is preferably 0.01 to 10 μm and more preferably 0.1 to 5 μm.

The refractive index (JIS K7142) of the light-reflective insulating particles formed of inorganic particles is preferably higher than that of the cured product of the thermosetting resin composition, and more preferably larger by at least about 0.02. This is because when a difference of the refractive index is small, the reflective efficiency on an interface therebetween decreases.

As the light-reflective insulating particles, the inorganic particles described above may be used. In addition, resin-coated metal particles formed by coating the surface of scale-like or spherical metal particles with a transparent insulating resin may be used. For the metal particles, nickel, silver, or aluminum may be used. Examples of the shape of the particles may include amorphous, spherical, scale-like, and needle-like shapes. Among these, the spherical shape is preferred in terms of light diffusing effect, and the scale-like shape is preferred in terms of total reflection effect. In particular, scale-like silver particles are preferred in terms of the light reflectance.

The size of resin-coated metal particles as the light-reflective insulating particles is different according to the shape. However, in general, when the size is too large, anisotropic conductive connection may be inhibited. When it is too small, light is unlikely to be reflected. Therefore, the particle diameter of spherical particles is preferably 0.1 to 30 μm and more preferably 0.2 to 10 μm. The longest diameter of scale-like particles is preferably 0.1 to 100 μm and more preferably 1 to 50 μm and the thickness thereof is preferably 0.01 to 10 μm and more preferably 0.1 to 5 μm. Here, when the particles have an insulating coating, the size of the light-reflective insulating particles is a size including the insulating coating.

As a resin in such resin-coated metal particles, various insulating resins may be used. From the viewpoints of mechanical strength, transparency, and the like, a cured product of acrylic resin can be preferably used. Preferred examples thereof may include a resin formed by radical copolymerization of methyl methacrylate and 2-hydroxyethyl methacrylate in the presence of a radical initiator such as organic peroxides including benzoyl peroxide. In this case, it is more preferable that the resin be cross-linked with an isocyanate-based crosslinker such as 2,4-tolylene diisocyanate. For the metal particles, it is preferable that a γ-glycidoxy group, a vinyl group, or the like have been introduced into the surface of metal in advance with a silane coupling agent.

For example, the resin-coated metal particles can be produced by adding metal particles and a silane coupling agent to a solvent such as toluene, stirring the mixture at room temperature for about 1 hour, adding a radical monomer, a radical polymerization initiator, and if necessary, a crosslinker to the mixture, and stirring the mixture while the mixture is heated to an initial temperature of radical polymerization.

When the mixing amount of the light-reflective insulating particles in the light-reflective anisotropic conductive adhesive as described above is too small, light reflection cannot be sufficiently achieved. When it is too large, connection due to the used conductive particles is inhibited. The light-reflective anisotropic conductive adhesive includes the light-reflective insulating particles in an amount of preferably 1 to 50% by volume and more preferably 5 to 25% by volume.

＜Conductive Particles＞

As the conductive particles constituting the light-reflective anisotropic conductive adhesive of the present invention, particles of metal used for conventional conductive particles for anisotropic conductive connection can be used. Examples thereof may include gold, nickel, copper, silver, solder, palladium, aluminum, an alloy thereof, and a multi-layered material thereof (for example, nickel plating/gold flash plating material). Among these, gold, nickel, or copper is used to form brown conductive particles, and therefore the particles can receive the full benefit of the effects of the present invention as compared with the other metal materials.

Further, as the conductive particles, metal-coated resin particles obtained by coating resin particles with a metal material may be used. Examples of such resin particles may include styrene-based resin particles, benzoguanamine resin particles, and nylon resin particles. As a method of coating resin particles with a metal material, a conventionally known method can be used, and an electroless plating method, an electrolytic plating method, or the like can be used. The thickness of layer of the metal material used for coating is enough to ensure favorable connection reliability, and depends on the particle diameter of the resin particles or the kind of metal. It is usually 0.1 to 3 μm.

When the particle diameter of the resin particles is too small, conduction failure is likely to occur, and when it is too large, patterns are likely to be short-circuited. Therefore, it is preferably 1 to 20 more preferably 3 to 10 μm, and particularly preferably 3 to 5 μm. In this case, it is preferable that the shape of a core particle 1 be spherical. Further, the shape may be flaky or a rugby ball shape.

The metal-coated resin particles are preferably spherical. When the particle diameter thereof is too large, connection reliability deteriorates. Therefore, it is preferably 1 to 20 μm and more preferably 3 to 10 μm.

Figure 1B:
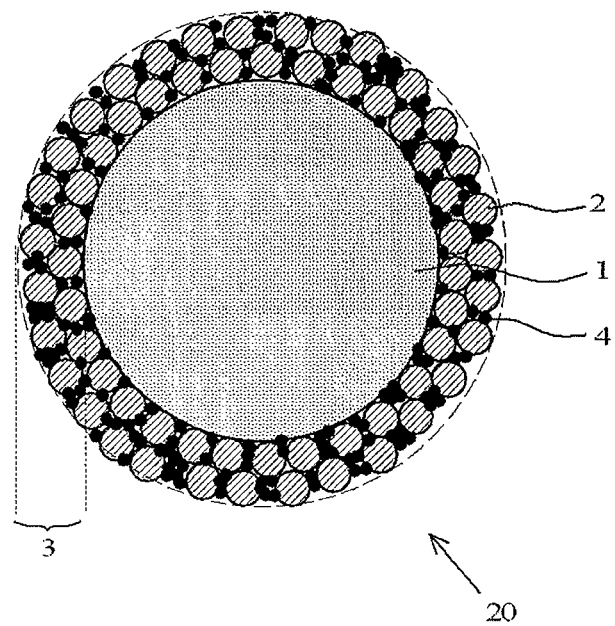
FIG. 1B is a cross-sectional view of a light-reflective conductive particle used for the light-reflective anisotropic conductive adhesive of the present invention.

In the present invention, it is particularly preferable that light reflectivity be imparted to the conductive particles as described above to form light-reflective conductive particles. FIGS. 1A and 1B are cross-sectional views of light-reflective conductive particles 10 and 20, respectively. The light-reflective conductive particles in FIG. 1A will be first described.

The light-reflective conductive particle 10 is configured to include a core particle 1 coated with a metal material, and a light-reflective layer 3 formed from at least one kind of inorganic particles 2 selected from titanium oxide ($TiO_2$) particles, boron nitride (BN) particles, zinc oxide (ZnO) particles, and aluminum oxide ($Al_2O_3$) particles on the surface of the core particle. The titanium oxide particles, boron nitride particles, zinc oxide particles, and aluminum oxide particles are inorganic particles appearing white under the sun light. Therefore, the light-reflective layer 3 made from the particles turns a white to gray color. The white to gray color of the light-reflective layer means that the wavelength dependency of reflectivity on the visible light is low and the visible light is likely to reflect.

When photodegeneration of a cured product of a thermosetting resin composition in a cured light-reflective anisotropic conductive adhesive is concerned, among the titanium oxide particles, boron nitride particles, zinc oxide particles, and aluminum oxide particles, the zinc oxide particles that have no catalytic properties with respective to the photodegeneration and a high refractive index can preferably be used.

Since the core particle 1 is subjected to anisotropic conductive connection, the surface of the core particle 1 is made from a metal material. Examples of aspects of particle having a surface coated with a metal material may include an aspect in which the core particle 1 itself is a metal material and an aspect in which the surface of resin particles is coated with a metal material.

From the viewpoint of size relative to the particle diameter of the core particle 1, when the thickness of the light-reflective layer 3 made from the inorganic particles 2 is too small as compared with the particle diameter of the core particle 1, the reflectance significantly decreases. In contrast, when it is too large, conduction failure occurs. Therefore, it is preferably 0.5 to 50% and more preferably 1 to 25%.

When the particle diameter of the inorganic particles 2 constituting the light-reflective layer 3 in the light-reflective conductive particle 10 is too small, a light reflection phenomenon is unlikely to occur, and when it is too large, formation of a light-reflective layer tends to be difficult. Therefore, it is preferably 0.02 to 4 μm, more preferably 0.1 to 1 μm, and particularly preferably 0.2 to 0.5 μm. In this case, from the viewpoint of wavelength of light to be reflected, it is preferable that the particle diameter of the inorganic particles 2 be 50% or more of wavelength of the light to be reflected (that is, light emitted by a light-emitting element) so that the light to be reflected does not permeate. In this case, examples of the shape of the inorganic particles 2 may include amorphous, spherical, scale-like, and needle-like shapes. Among these, the spherical shape is preferred in terms of light diffusion effect, and the scale-like shape is preferred in terms of total reflection effect.

The light-reflective conductive particle 10 in FIG. 1A can be produced by a known film formation technique (so-called mechano-fusion method) in which powders of various sizes physically collide to form a film made from particles having a smaller particle diameter on the surface of particles having a larger particle diameter. In this case, the inorganic particles 2 are fixed to the metal material on the surface of the core particle 1 so as to enter into the metal material, and on the other hand, the inorganic particles are unlikely to be fixed by fusion. Therefore, a monolayer of the inorganic particles constitutes the light-reflective layer 3. In FIG. 1A, the thickness of the light-reflective layer 3 may be equal to or slightly less than the particle diameter of the inorganic particles 2.

Next, the light-reflective conductive particle 20 in FIG. 1B will be described. The light-reflective conductive particle 20 is different from the light-reflective conductive particle 10 in FIG. 1A in that a light-reflective layer 3 includes a thermoplastic resin 4 functioning as an adhesive, and inorganic particles 2 are fixed by the thermoplastic resin 4, so that multi-layers (for example, two layers or three layers) of the inorganic particles 2 are formed. The presence of the thermoplastic resin 4 improves the mechanical strength of the light-reflective layer 3, and therefore the separation of the inorganic particles is unlikely to occur.

As the thermoplastic resin 4, a halogen-free thermoplastic resin can be preferably used for reduction of environmental impact. For example, polyolefin such as polyethylene and polypropylene, polystyrene, an acrylic resin, or the like, can be preferably used.

Such a light-reflective conductive particle 20 can also be produced by the mechano-fusion method. When the particle diameter of the thermoplastic resin 4 applicable for the mechano-fusion method is too small, the adhesion function deteriorates, and when it is too large, the thermoplastic resin 4 is unlikely to adhere to the core particle 1. Therefore, it is preferably 0.02 to 4 μm and more preferably 0.1 to 1 μm.

Further, when the mixing amount of the thermoplastic resin 4 is too small, the adhesion function deteriorates, and when it is too large, agglomerates of the particles are formed. Therefore, it is preferably 0.2 to 500 parts by mass and more preferably 4 to 25 parts by mass, relative to 100 parts by mass of the inorganic particles 2.

When the mixing amount of the conductive particles such as light-reflective conductive particles in the light-reflective anisotropic conductive adhesive of the present invention is too small, conduction failure is likely to occur, and when it is too large, patterns are likely to be short-circuited. Therefore, the mixing amount of the conductive particles such as light-reflective conductive particles is preferably 1 to 100 parts by mass and more preferably 10 to 50 parts by mass, relative to 100 parts by mass of the thermosetting resin composition.

<Production of Light-Reflective Anisotropic Conductive Adhesive>

The light-reflective anisotropic conductive adhesive of the present invention can be produced by uniformly mixing the light-reflective insulating particles, the conductive particles, and the thermosetting resin composition, as described above, in accordance with a conventional method. Further, a light-reflective anisotropic conductive adhesive film may be formed by dispersing and mixing them in a solvent such as toluene, and applying the resultant mixture to a PET film having been subjected to a peeling treatment so as to be a desired thickness, followed by drying at about 80° C.

<Reflectivity of Light-Reflective Anisotropic Conductive Adhesive>

In the reflectivity of the light-reflective anisotropic conductive adhesive of the present invention, it is desirable that the cured product of the light-reflective anisotropic conductive adhesive have a reflectance (JIS K7105) to the light having a wavelength of 450 nm of at least 30% to improve the light-emitting efficiency of a light-emitting element. In order to obtain such a reflectance, the reflectivity and the mixing amount of the used light-reflective conductive particles, the mixing composition of the thermosetting resin composition, and the like, may be appropriately adjusted. In general, when the mixing amount of the light-reflective conductive particles having favorable reflectivity is increased, the reflectance also tends to increase.

Note that the reflectivity of the light-reflective anisotropic conductive adhesive can be evaluated in terms of refractive index. This is because when the refractive index of the cured product thereof is larger than the refractive index of a cured product of the thermosetting resin composition except for the conductive particles and the light-reflective insulating particles, the light reflection amount on the interface between the light-reflective insulating particles and the cured product of the thermosetting resin composition surrounding the particles increases. Specifically, it is desirable that a difference obtained by subtracting the refractive index (JIS K7142) of the cured product of the thermosetting resin composition from that of the light-reflective insulating particles be preferably 0.02 or more and more preferably 0.2 or more. The refractive index of a thermosetting resin composition including an epoxy resin as a main component is usually about 1.5.

<Light-Emitting Device>

Figure 2:
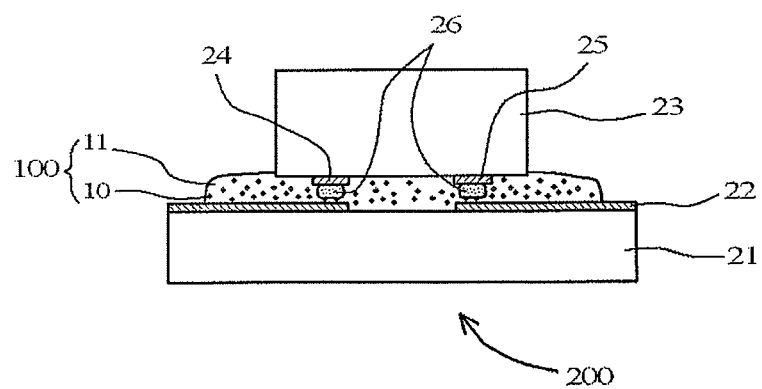
FIG. 2 is a cross-sectional view of a light-emitting device of the present invention.
Figure 3:
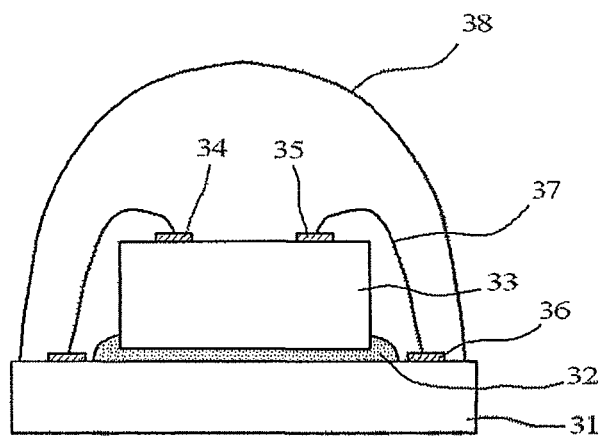
FIG. 3 is a cross-sectional view of a conventional light-emitting device.
Figure 4:
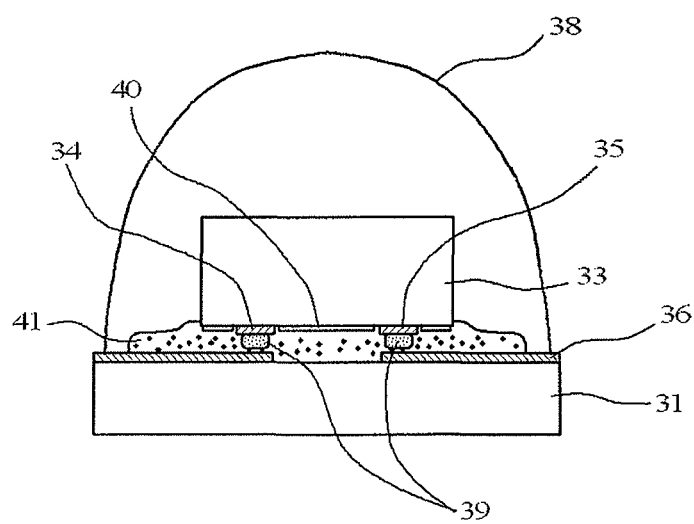
FIG. 4 is a cross-sectional view of another conventional light-emitting device.

Next, the light-emitting device of the present invention will be described with reference to FIG. 2. A light-emitting device 200 is formed by applying the above-described light-reflective anisotropic conductive adhesive of the present invention to spaces between a connection terminal 22 on a substrate 21 and connection bumps 26 each provided to an n electrode 24 and a p electrode 25 of an LED element 23 as a light-emitting element and flip-chip mounting the substrate 21 and the LED element 23. In this case, a cured product 100 of the light-reflective anisotropic conductive adhesive is a cured product 11 of the thermosetting resin composition in which light-reflective insulating particles and conductive particles, and preferably light-reflective conductive particles 10 are dispersed. If necessary, the LED element 23 may be sealed with a transparent mold resin so as to cover the entire LED element 23. In addition, a light-reflective layer may be provided to the LED element 23 in the same manner as in the conventional case.

In the thus configured light-emitting device 200, of light emitted by the LED element 23, the light emitted toward the substrate 21 is reflected on the light-reflective insulating particles and the light-reflective conductive particles 10 in the cured product 100 of the light-reflective anisotropic conductive adhesive, and is allowed to exit through the upper face of the LED element 23. Therefore, a reduction in the light-emitting efficiency can be prevented.

Components (the LED element 23, bumps 26, substrate 21, connection terminals 22, etc.) other than the light-reflective anisotropic conductive adhesive in the light-emitting device 200 of the present invention may be the same as those in the structure of a conventional light-emitting device. Further, the light-emitting device 200 of the present invention can be produced in the same manner as in a conventional anisotropic conductive connection technique except that the light-reflective anisotropic conductive adhesive of the present invention is used. As the light-emitting element, a known light-emitting element in addition to the LED element can be used within a range not impairing the effects of the present invention.

EXAMPLES

Reference Example (Production of Diglycidyl Isocyanuryl Modified Polysiloxane)

28.12 g (100.00 mmol) of 1-allyl-3,5-diglycidyl isocyanurate (MADGIC available from Shikoku Chemicals Corporation) and 11.31 g (40.02 mmol) of 1,3-bis(trimethylsiloxy)-1,3-dimethylsiloxane (SIB1838.0 available from Gelest Inc.) were placed in a 100-mL three-neck flask equipped with a reflux condenser and a magnetic stirrer under nitrogen flow, and the mixture was stirred at 80° C. until uniform melting. Subsequently, 45.0 µL of 2% Karstedt catalyst solution (xylene solution) was added to the molten mixture. The mixture was heated to 120° C. with stirring. The temperature of the molten mixture reached 120° C., and the temperature was held for 9 hours to react 1-allyl-3,5-diglycidyl isocyanurate with 1,3-bis(trimethylsiloxy)-1,3-dimethylsiloxane.

After completion of the reaction, the reaction mixture was cooled, and the unreacted monomer was distilled off under reduced pressure (150° C./0.1 kPa). The residue was treated by a column chromatograph (carrier: silica gel, eluate: ethyl acetate/hexane mixed solvent) to obtain a diglycidyl isocyanuryl modified polysiloxane of a formula (1a) with less coloring.

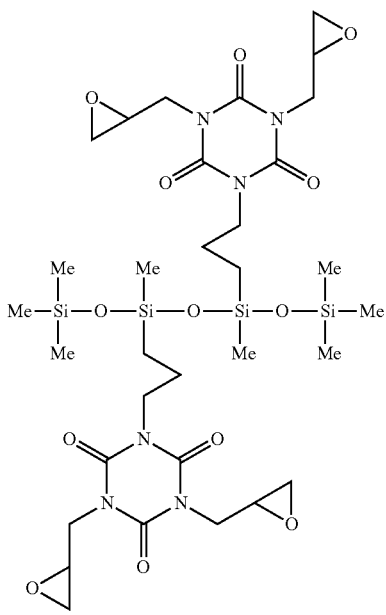

(1a)

Example 1 and Comparative Examples 1 to 3

Light-reflective anisotropic conductive adhesives were prepared by uniformly mixing components to be mixed shown in Table 1.

In Example 1, an epoxy compound was mixed with an acid anhydride-based curing agent so that the ratio of epoxy group to functional group of acid anhydride was 1/1.1. The anisotropic conductive adhesive of Comparative Example 2 was prepared by mixing light-reflective insulating particles and conductive particles in a two-liquid curable dimethyl silicone resin (IVS4742 available from Momentive Performance Materials Inc.). The anisotropic conductive adhesive of Comparative Example 3 was prepared by mixing light-reflective insulating particles and conductive particles in a two-liquid curable phenyl silicone resin (SCR-1012 available from Shin-Etsu Chemical Co., Ltd.).

(Evaluation)

The die shear strength of the obtained light-reflective anisotropic conductive adhesive was measured as described below. The thermosetting resin composition, the remaining part of the light-reflective anisotropic conductive adhesive from which the light-reflective insulating particles and the conductive particles was removed, was subjected to a heat-resistance test and a heat and light-resistance test, as described below. The obtained results are shown in Table 2.

<Die Shear Strength Test>

A curable resin composition was applied to a glass epoxy substrate for an LED (custom item available from Kansai Denshi Kogyo Co., Ltd.) that had a silver solid electrode with a thickness of 10 µm in which gold bumps (height: 10 µm, diameter: 80 µm, pitch: 190 µm) were formed so that the diameter thereof was 4 mm. A flip chip type LED element (GM35R460G available from Showa Denko K.K.) of a 0.3-mm square was mounted on the curable resin composition. The glass epoxy substrate was placed on a hot plate held at 80° C. with the flip chip type LED element located on the upper surface side, and heated for 2 minutes. Thus, the LED element was temporally fixed to the glass epoxy substrate for an LED. The glass epoxy substrate for an LED to which the LED element was temporally fixed was applied to a thermocompression bonding device. While a pressure of 80 gf/chip was applied to the LED element, a thermocompression bonding treatment was performed at 230° C. for 15 seconds. Thus, an LED device in which the LED element was mounted on the glass epoxy substrate for an LED was produced. In the LED device produced using the light-reflective anisotropic conductive adhesive of Example 1 or Comparative Example 1, after the thermocompression bonding treatment, a reflow treatment at 260° C. for 20 seconds was performed.

The die shear strength (gf/chip) of the produced LED device was measured. It is desirable that the die shear strength be at least 200 gf/chip and preferably 250 gf/chip or more for practical use.

<Heat-Resistance Test>

The thermosetting resin composition was interposed between two aluminum plates (100 mm in length, 50.0 mm in width, and 0.500 mm in thickness) in which spacers with a height of 1 mm were disposed at four corners. The thermosetting resin composition of each of Example 1 and

TABLE 1

|  |  | Example | Comparative Example | | |
|---|---|---|---|---|---|
|  |  | 1 | 1 | 2 | 3 |
| Epoxy Compound | Polysiloxane of Formula (1a) Prepared in Reference Example | 53.14 | — | Two-Liquid Curable Dimethyl Silicone Resin | Two-Liquid Curable Phenyl Silicone Resin |
|  | 1,3,5-triglycidyl isocyanurate (TEPIC) | — | 42.56 | | |
| Acid Anhydride-Based Curing Agent | 4-methylhexahydrophthalic anhydride/ hexahydrophthalic anhydride = 70/30 (RIKACID MH-700) | 42.58 | 64.94 | | |
| Imidazole-based Curing Accelerator | 2-ethyl-4-methylimidazole | 0.30 | 0.30 | | |
| Light-Reflective Insulating Particles | Titanium Dioxide Powder with Average Particle Diameter of 0.5 µM (KR-380 available from Titan Kogyo, Ltd.) | 24.00 | 24.00 | 24.00 | 24.00 |
| Conductive Particles | Au-Coated Resin Conductive Particles with Average Particle Diameter of 5 µm (Particles in which electroless gold plating with thickness of 0.2 µm is formed on spherical acrylic resin particles with average particle diameter of 4.6 µm (BRIGHT 20GNB4.6EH available from Nippon Chemical Industrial Co., Ltd.)) | 5.00 | 5.00 | 5.00 | 5.00 |

Comparative Example 1 was heated first at 120° C. for 30 minutes, and then at 140° C. for 1 hour to produce a cured resin sheet. The thermosetting resin composition of each of Comparative Examples 2 and 3 was heated first at 80° C. for 1 hour, and then at 150° C. for 2 hours to produce a cured resin sheet.

The produced cured resin sheets were left in an oven set at 150° C. for 1,000 hours. The spectral properties (L*, a*, b*) of the sheets before and after being left were measured with a spectrophotometer (CM-3600d manufactured by Konica Minolta, Inc.). A color difference (ΔE) was calculated from the measured values. For practical use, it is desired that ΔE be 35 or less.

<Heat and Light-Resistance Test>

A cured resin sheet that was the same as that subjected to the heat-resistance test was produced. The cured resin sheet was left for 1,000 hours in a heat and light tester (SUPER WIN MINI manufactured by DAYPLA WINTES CO., LTD., using metal halide lamp) that was set to a temperature of 120° C. and a light intensity of 16 mW/cm². The produced cured resin sheet was left in an oven set at 150° C. for 1,000 hours. The spectral properties (L*, a*, b*) of the sheet before and after being left were measured with a spectrophotometer (CM-3600d manufactured by Konica Minolta, Inc.). A color difference (ΔE) was calculated from the measured values. For practical use, it is desired that ΔE be 20 or less.

TABLE 2

| | | Example | Comparative Example | | |
|---|---|---|---|---|---|
| | | 1 | 1 | 2 | 3 |
| Die Shear Strength | [gf/chip] | 294 | 535 | 40 | 150 |
| Heat Resistance Test | Color Difference ΔE | 14.6 | 37.1 | — | — |
| Heat and Light Resistance Test | Color Difference ΔE | 8.7 | 16.9 | — | — |

As seen from Table 2, the die shear strength and the results in the heat-resistance test and the heat and light-resistance test of the light-reflective anisotropic conductive adhesive of Example 1 are all preferred for practical use. In Comparative Example 1, the obtained die shear strength is preferred since the thermosetting epoxy resin composition is used. However, the result in the heat-resistance test is insufficient since the diglycidyl isocyanuryl modified polysiloxane of the formula (1a) is not used.

In Comparative Examples 2 and 3, the die shear strength is significantly low since both the diglycidyl isocyanuryl modified polysiloxane of the formula (1a) and the thermosetting epoxy resin composition are not used. Therefore, the heat-resistance test and the heat and light-resistance test do not need to be performed.

INDUSTRIAL APPLICABILITY

According to the light-reflective anisotropic conductive adhesive of the present invention, the light-emitting efficiency cannot be reduced even without providing a light-reflective layer to a light-emitting element such as a light-emitting diode (LED) element, where the light-reflective layer may increase the production cost during production of a light-emitting device by flip-chip mounting the light-emitting element on a wiring substrate using the anisotropic conductive adhesive. In addition, the die shear strength can be highly maintained and the heat resistance and resistance to heat and light are excellent. Therefore, the light-reflective anisotropic conductive adhesive of the present invention is useful in flip-chip mounting of an LED element.

REFERENCE SIGNS LIST 1 core particle
2 inorganic particle
3 light-reflective layer
4 thermoplastic resin
10, 20 light-reflective conductive particle
11 cured product of thermosetting resin composition
21 substrate
22 connection terminal
23 LED element
24 n electrode
25 p electrode
26 bump
100 cured product of light-reflective anisotropic conductive adhesive
200 light-emitting device

The invention claimed is:
1. A light-reflective anisotropic conductive adhesive used for an electrically anisotropic conductive connection of a light-emitting element to a wiring substrate, the light-reflective anisotropic conductive adhesive comprising
a thermosetting resin composition,
conductive particles,
a curing agent for an epoxy resin, and
light-reflective insulating particles, wherein
the curing agent for an epoxy resin is an acid anhydride-based curing agent, and
the thermosetting resin composition includes a diglycidyl isocyanuryl modified polysiloxane represented by the formula (1)

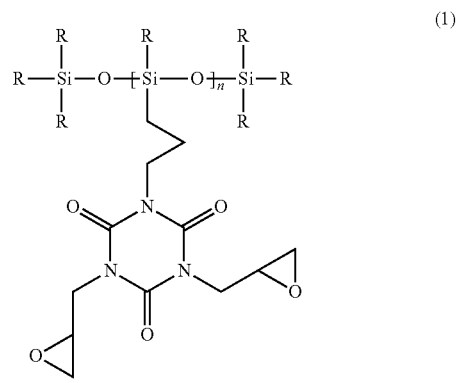

wherein in the formula, R represents an alkyl group or an aryl group, and n represents an integer of 1 to 40.

2. The light-reflective anisotropic conductive adhesive according to claim 1, wherein R is a methyl group.

3. The light-reflective anisotropic conductive adhesive according to claim 1, wherein the thermosetting resin composition includes 50 to 120 parts by mass of the curing agent for an epoxy resin relative to 100 parts by mass of the diglycidyl isocyanuryl modified polysiloxane of the formula (1).

4. The light-reflective anisotropic conductive adhesive according to claim 1, wherein the thermosetting resin composition further includes an imidazole-based curing accelerator.

5. The light-reflective anisotropic conductive adhesive according to claim 4, wherein the thermosetting resin composition includes 0.20 to 2.00 parts by mass of the imidazole-based curing accelerator relative to 100 parts by mass of the acid anhydride-based curing agent.

6. The light-reflective anisotropic conductive adhesive according to claim 1, wherein the light-reflective insulating particles are at least one kind of inorganic particles selected from the group consisting of titanium oxide particles, boron nitride particles, zinc oxide particles, and aluminum oxide particles.

7. The light-reflective anisotropic conductive adhesive according to claim 1, wherein the light-reflective insulating particles have a refractive index (JIS K7142) higher than a refractive index (JIS K7142) of a cured product of the thermosetting resin composition.

8. The light-reflective anisotropic conductive adhesive according to claim 1, wherein the light-reflective insulating particles are resin-coated metal particles in which a surface of flaky or spherical metal particles is coated with an insulating resin.

9. The light-reflective anisotropic conductive adhesive according to claim 1, comprising 1 to 50% by volume of the light-reflective insulating particles.

10. The light-reflective anisotropic conductive adhesive according to claim 1, wherein the conductive particles are light-reflective conductive particles each having a core particle coated with a metal material and a light-reflective layer formed from at least one kind of inorganic particles selected from titanium oxide particles, boron nitride particles, zinc oxide particles, and aluminum oxide particles on the surface of the core particle.

11. The light-reflective anisotropic conductive adhesive according to claim 10, wherein a mixing amount of the light-reflective conductive particles is 1 to 100 parts by mass relative to 100 parts by mass of the thermosetting resin composition.

12. A light-emitting device produced by flip-chip mounting a light-emitting element on a wiring substrate with the light-reflective anisotropic conductive adhesive according to claim 1 interposed therebetween.

13. The light-emitting device according to claim 12, wherein the light emitting element is a light-emitting diode.

14. The light-reflective anisotropic conductive adhesive according to claim 1, comprising 5 to 25% by volume of the light-reflective insulating particles.

15. The light-reflective anisotropic conductive adhesive according to claim 1, wherein n represents 2.

16. The light-reflective anisotropic conductive adhesive according to claim 1, wherein the diglycidyl isocyanuryl modified polysiloxane is represented by the formula (1a):

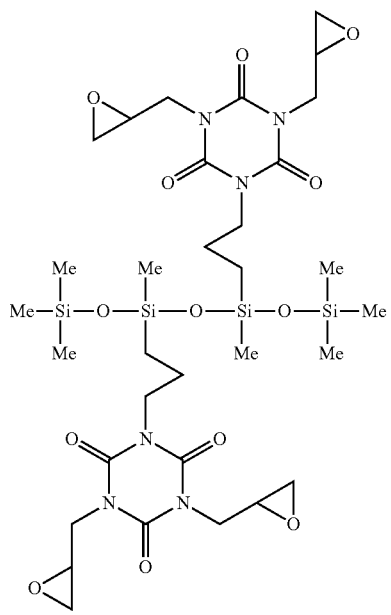

(1a)

17. A light-reflective anisotropic conductive adhesive used for an electrically anisotropic conductive connection of a light-emitting element to a wiring substrate, the light-reflective anisotropic conductive adhesive comprising
a thermosetting resin composition,
conductive particles,
a curing agent for an epoxy resin, and
light-reflective insulating particles, wherein
the curing agent for an epoxy resin is an imidazole-based curing agent, and
the thermosetting resin composition includes a diglycidyl isocyanuryl modified polysiloxane represented by the formula (1)

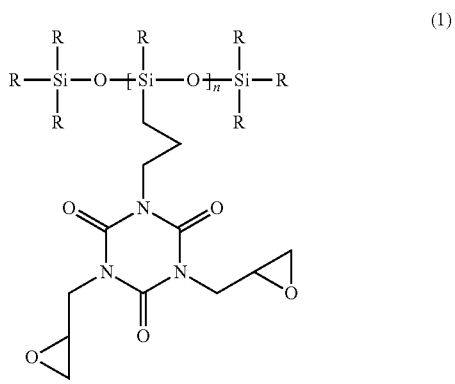

(1)

wherein in the formula, R represents an alkyl group or an aryl group, and n represents an integer of 1 to 40.

* * * * *